United States Patent [19]
Goldberg

[11] 3,995,261
[45] Nov. 30, 1976

[54] RECONFIGURABLE MEMORY

[75] Inventor: Jacob Goldberg, Palo Alto, Calif.

[73] Assignee: Stanford Research Institute, Menlo Park, Calif.

[22] Filed: Feb. 24, 1975

[21] Appl. No.: 552,646

[52] U.S. Cl. .................... 340/173 BB; 340/173 R; 340/173 AM
[51] Int. Cl.² .................. G11C 7/00; G11C 11/40; G11C 15/00
[58] Field of Search .... 340/173 BB, 173 R, 173 SP, 340/173 AM, 172.5; 307/204, 219

[56] References Cited
UNITED STATES PATENTS 3,422,402   1/1969   Sakalay.................... 340/173 BB
3,940,740   2/1976   Coontz..................... 340/173 BB

*Primary Examiner*—Alfred H. Eddleman
*Attorney, Agent, or Firm*—Lindenberg, Freillich, Wasserman, Rosen & Fernandez

[57] ABSTRACT

A memory organization is provided which can tolerate a large number of faults at a low cost in redundancy. This is done by transferring the contents of the faulty storage cells in the memory to other storage cells in the memory and providing for a switching arrangement whereby the address of the faulty storage cells will cause the readout of data from the cells to which the data has been transferred.

7 Claims, 8 Drawing Figures

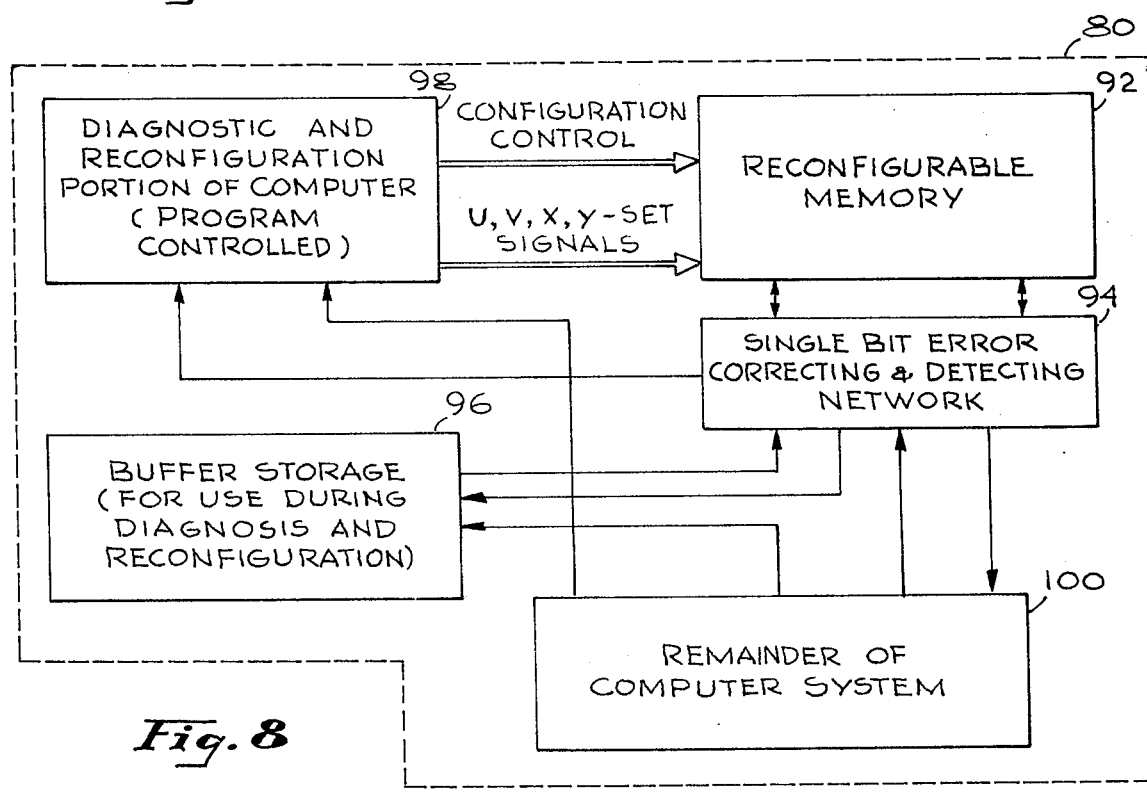

RECONFIGURABLE MEMORY

BACKGROUND OF THE INVENTION

This invention relates to data storage memory systems and more particularly to improvements therein.

One of the problems which confronts manufacturers of memories of the type that have rows and columns of storage cells, is that after the memory is assembled, it is found that one or more of the storage elements are defective. It can also happen, that after the memory is in use, the one or more of the storage elements can become defective for a number of reasons, which are of no concern here. A number of different approaches are taken to overcome such defects unless the number of defective elements is so large as to require scrapping the memory. A favored technique is to use spare rows and/or spare columns of memory elements to store data which cannot be stored in regular rows or columns in memory and the entire row or column in the memory in which defective elements are present is not used.

This technique, while effective, increases the cost of the memory and can also cause a greater reduction in the storage capacity of the memory that is actually required by the number of defective storage elements.

OBJECT AND SUMMARY OF THE INVENTION

An object of this invention is the provision of a novel method and means for reconfiguring a memory to take care of defective storage elements.

Yet another object of this invention is the provision of a memory reconfiguration technique which is economical.

Still another object of this invention is the provision of a memory reconfiguration technique which is simpler than those heretofore available.

The above and other objects of this invention may be achieved by providing a spare column of storage chips or elements for the memory. If there is only one defective chip in a row, then data is shifted to skip the defective chip and to use the chip in the spare column instead.

If there are n defective chips in a row then data in the chips in n adjacent rows, including the row having the defective chips, is shifted to the adjacent chip in each row, to use the spare chip in that row. The chips that have their data shifted are in the same columns of chips as contain the defective chips as well as all the columns of chips between the defective chip columns and the spare column of chips, (a shift to the right).

The data in the one of the defective chips in the row which is adjacent to a now vacant chip, because of the shift of data to the right, is transferred to that vacant chip. The data in the chips in the same columns as the defective chips and in the adjacent row is now shifted to the chips in the next adjacent row to permit the data intended to be stored in the defective chips to be stored therein. The data transfer continues from chips in one row to chips in an adjacent row until all data displaced as a result of the transfer of data from defective chips has taken place.

It will be found that this displacement of data from row to row occurs over n rows, including the one containing the defective chips. Also as the data transfer progresses, one less data transfer between successive rows is required. This occurs because each time the data is stored in an adjacent row, the amount of data to be stored in the next adjacent row is decreased by one in view of the presence of the spare storage element in a row.

Provision for switching is made on the memory chips so that no change in addressing the memory is required to read out the data from a given row even though some of the data in that row have been transferred to other rows in the process of reconfiguring the memory.

BRIEF DESCRIPTION OF THE DRAWINGS

FIGS. 4, 5 and 6 are illustrations showing examples of memory reconfiguration in accordance with this invention.

FIG. 8 is a schematic circuit of a reconfigurable memory.

DESCRIPTION OF THE PREFERRED EMBODIMENTS

Figure 1:
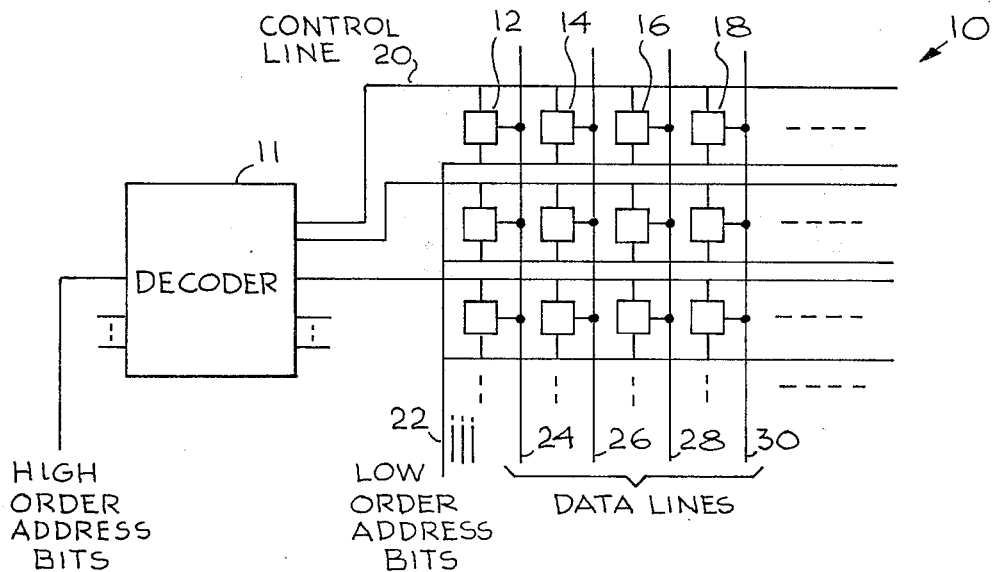
FIG. 1 illustrates a conventional LSI memory organization, which is shown to assist in an understanding of this invention.

Referring now to FIG. 1, there is shown a schematic diagram of a conventional, LSI memory organization, of a type with which this invention may be employed. It includes an array of chips 10 and a decoder 11, to which high order address bits, obtained from the memory address word, are applied in order to select one of the row of chips, 12, 14, 16, 18 for example in which data is to be stored or from which data read-out is to occur. Each chip is of the well known type which contains a set of storage bits. The bits are accessible only when the chip control input is energized. The high order address bits are used to select one of the control lines, 20. Low order address bits are applied to a set of lines that go to all chips. For example, 22 is one of the set of lines which is used for bit element selection within a memory chip.

The data lines, respectfully, 24, 26, 28, 30, route data to and from the chips.

Figure 2:
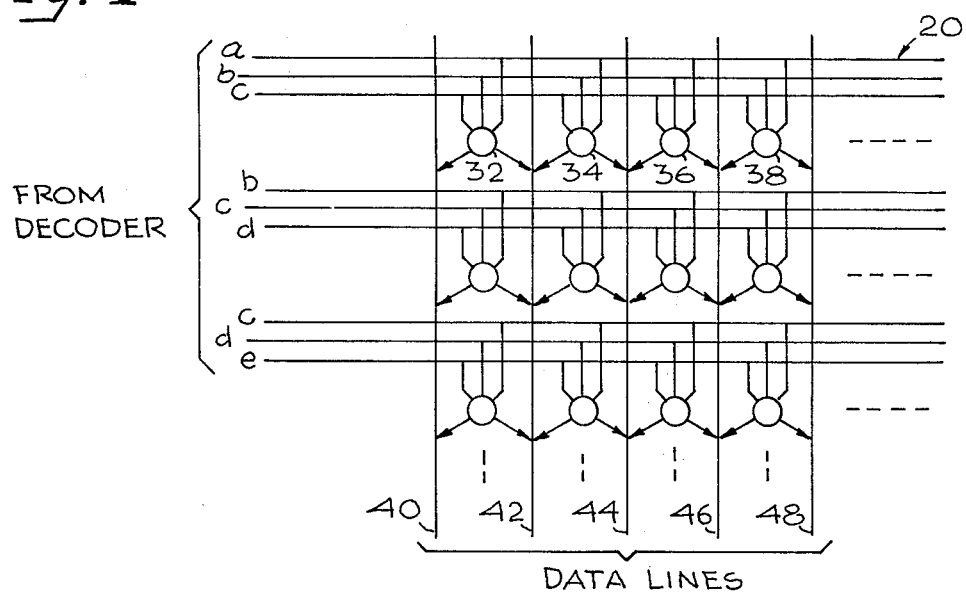
FIG. 2 is a schematic illustration of a reconfigurable memory in accordance with this invention.

FIG. 2 represents schematically, a chip reconfigurable memory, in accordance with this invention. Here, each chip can be selected by one of three control lines, for example, the chips 32, 34, 36, 38 by the lines designated by the letters a, b, c. It should be understood that each one of the conventional memory control lines such as 20, is replaced by three control lines, for example, for each row. The first row has lines a, b, c. The second row has lines b, c, d. The third row has lines c, d, e. For any given memory address, the decoder will excite one and only one set of three control lines. For example, the three control lines designaated by the letter c constitutes one set. It should be noted that the data lines 40, 42, 44, 46 and 48, are arranged so that the chips in the first column of chips are connected to the lines 40 and 42. The chips in the second column of chips are connected to the lines 42 and 44. The chips in the third column of chips are connected to the lines 44 and 46, etc. The chips in the last column of chips use the data line 40 as one of their lines. This is known as "wrap-around," and it occurs with the data lines wherein the left most data line is also connected to the right most chips column, and similarly for the top and bottom control lines. An extra column of chips is provided, which can be regarded as spares and which will be considered here as the right most column. Each spare chip is controlled independently.

Figure 3:
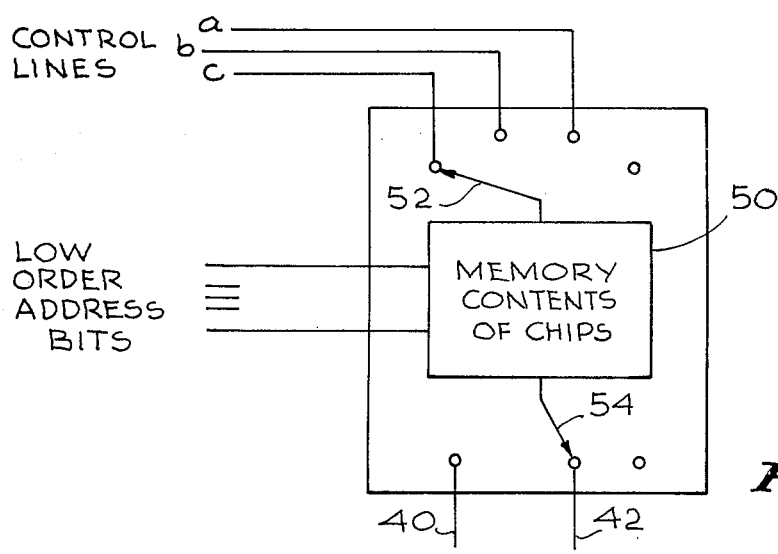
FIG. 3 is a schematic illustration of a memory chip in accordance with this invention.

To further facilitate an understanding of the invention, FIG. 3 shows a memory chip with an input and output switching arrangement, shown here as a mechanical switch for purposes of explanation, in accordance with this invention. The electronic equivalent will be shown and described later herein. In accordance with this invention, the chip 50 is provided with a switching arrangement 52 which can select any one of the control lines, for example a b, c or none of them. The chip 50 is also provided with an output switch 54, which can select one or the other of the data select lines 40, 42 or none of them.

Considering now FIG. 4, there is shown a reconfiguration example in accordance with this invention. To simplify a discussion of the reconfiguration capabilities of this invention, a notation for lettering chips is provided to indicate the setting of the switches, as represented in FIG. 5 which are connected to these chips. The letter of the alphabet used indicates the control line to which the chip is connected by the control switch 52. The use of an upper case letter indicates that an output switch of a chip is connected to the right data line and the use of a lower case letter indicates that the output of the chip is connected to the left data line. This may be seen in FIG. 2 where, for example the chip 32 has an upper case letter B adjacent the line connecting it to the right data line and a lower case letter $b$ connecting it to the left data line.

In FIG. 4, the column on the right side of the arrangement represents the column of spares. The first row, R1 bearing upper case B and the dash in the last column indicates that there are no faults in that row. Similarly the second row, R2, bearing the upper case C and the dash in the last column indicates that there are no faults in that row. All the chips in the B and C rows are connected to the data lines to the right.

The Row R3, shows a fault in the third column, which is represented by an asterisk. This single fault is easily handled by the element or chip in the spare column. The first two chips in the row are respectively connected to the data lines to the right, the remainder of the chips in the row outside of the defective chip, are connected to the data lines to the left, as signified by the representations with lower case $d$'s. It is seen that each data line is thereby connected to a non-defective chip.

The Row R4 has no faults and as shown by the upper case E's therein, the chips are all connected to the right data line. Row R5, the fifth row, has three faults respectively in the fourth, fifth and sixth columns. The data bits which would be stored in the fourth and fifth columns in the fifth row are stored in the sixth row immediately below. This is represented by the two upper case F's in the fourth and fifth columns of the sixth row, R6. The displacement of data to a chip of an adjacent row is accomplished row is accomplished by setting the chip control selector to the appropriate one of the three available control lines. For example, the F decoder output is available on rows R4, R5, and R6, so that F-selected data may appear in any of those rows. In the fifth row, R5, it will be noted that the data to be stored in the last three columns are shifted one element to the right in the same row and are represented by the lower case $f$'s, indicative of the fact that these chips are connected to the left data lines. In the sixth row, the data which was to be stored in the locations now occupied by the two F's is disposed as follows: The data which was to be stored in the fourth column of the sixth row is displaced downward to the chip in the adjacent seventh row. The remainder of the H data which was to be stored in the seventh row is displaced one place to the right. All the data can be accomodated in view of the spare column. The use of the lower case $h$ indicates that the chips are connected to the left data lines. In the sixth row, the remainder of the G data to be stored is displaced to the right one place, as indicated by the lower case $g$.

The rules of the reconfiguration may be expressed as follows: In the event of a single fault in a row, data in all chips commencing with the data in the faulty chip is shifted to chips one place to the right to include the storage chip in the spare column.

In the event of two or more faults, displace data in the chips commencing with data in the faulty chip closest to the spare column of chips, one chip to the right to use the spare chip in that row. The data in each of the chips in the same columns as the faulty chips, to the right of those columns and in (n-1) adjacent rows is transferred to the adjacent chip in the same row so that all data is shifted one chip to the right in the indicated rows leaving one chip without data. The data that should have been stored in all of the faulty chips but the one already taken care of is then transferred to the chips in the same column and in an immediately adjacent row. The data in the chips in that immediately adjacent row which have received the defective chip data, have their data shifted to chips in the same columns but in an immediately adjacent row.

This shifting from row to row continues until all of the shifted data bits have been taken care of. One less shift is required for each successive data transfer between rows. It is also necessary to note that when there is a shift from row to row, there is no change in the data lines to which the chip receiving the shifted data is connected. However, when there is a shift from column to column, then there is a switch from a right data line to a left data line, for a chip which receives the shifted data.

From the foregoing it should be seen that a fault pattern of n chips in a row can be handled with n rows. The rows below or above a fault may be used for reconfiguration. In general, the pattern used to accomodate a fault is not uniquely determined. The pattern employed may be chosen so as to better accomodate other nearby faults.

The example of a fault pattern shown in the R10, R11, and R12 rows of FIG. 4 illustrate a pattern that cannot be handled by this scheme because while the R10 and R12 row faults can be handled using adjacent rows, there are no chips that can serve row L.

FIG. 5 shows how a memory may be reconfigured to handle a number of faults in a row using the rows of chips on either side of the row containing the faulty chips. It will be seen that the fourth row R4, contains five faults. The data stored in the faulty chip next to the spare chip in the fourth row is transferred to be stored in the spare chip in the fourth row and by the $a$ designation, it should be clear the output switch of the chip in the spare row is connected to the left data input line. The data which would have been stored in the first two faulty chips in the fourth row is transferred to the chips in the same column in the adjacent upper row R3, as indicated by the two upper case A's. The data which would have been stored in the second chip of the third row, R3, is shifted upward to the chip in the same column in the adjacent row R2. The remaining data in row R3 is shifted one chip to the right to use and to make room for the data received from the fourth row and the output switches of these chips are all connected to the left data lines as indicated by the representations of these chips by the lower case p. Similarly, the data in row R2 is displaced one chip to make room for the data received from row R3 and these chips are all connected to their left data lines as indicated by q.

The data which would have been stored in the third and fourth faulty chips is transferred to the fifth and sixth chips in the fifth, R5 row. R5 data which would have otherwise been stored in these locations, is divided as follows: the data in one of these chips, the one next to the spare chip is shifted into the spare chip and the data in R5 is shifted downwardly to the next row R6 and to the adjacent chip to the right. The data in row R6 which would have been otherwise stored in the chip now occupied by the data from the row R5 chip is transferred to the spare chip in row R6.

It should be noted that the data in the faulty chips that is shifted upwardly in the same column to an adjacent row has no changes made in the connections to the data lines. These chips are connected to the data lines at the right. However, because of the data shift in the row containing the faulty chips to the left to fill the spare chip, the transposition of the data to the adjacent lower row is not made within the same columns and therefore the switches are set to connect these chips to the data lines on the left. The selection of the data lines to which the switches on the chips are connected is such that the chip data will occupy the same position with respect to data of adjacent chips as it occupies if there were no faulty chips.

FIG. 6 is an illustration of still another pattern of faults for which a memory can be reconfigured in accordance with this invention. There are two separate sets of defective chips in the first row, and the memory is reconfigured to handle these one at a time. These are enclosed in dashed lines respectively 56, 58. Reconfiguration for the first faulty chip set 56 is performed in the same way as was described previously. The data in two of the three faulty chips, (the first two) is shifted into the chips in the adjacent row immediately below. The data in the third faulty chip in the first row is shifted into the chip adjacent thereto in the first row while the data which otherwise would have occupied that chip is shifted to the adjacent chip in the first row. The data that was stored in the sixth chip in the first row is now transferred to the seventh chip of the second row, R2. The data which should have been stored in the seventh chip in row R1, which is a faulty chip is transferred to the eighth chip in the second row, R2. The data that would have been stored in the eighth chip in row R1 is transferred to the spare chip in the first row. Without the second set of defective chips, 58, the data in all of the first row chips of commencing with that in the fourth faulty chip is shifted to the right one chip to fill the spare chip. Actually, something analagous to this takes place except that where the chip to which a transfer is to be made is defective, the data transfer is made to a chip in the adjacent row and in the same column as the defective chip.

The data in the second and third chips in row R2 is the data transferred directly from the second and third faulty chips in the first row. It will be noted that the chips are represented by A. A transfer directly downward between rows does not require that the connection to the data line be made from the right to the left data line. However, a shift along a row either alone or followed by a downward transfer does require the selection of the left data line. Thus, the data in the first row which is shifted downward and one position to the right in the second row is represented by a.

The data in the second row which was transferred to the second chip within the same column in the third row R3, is represented by B. Since the data in the second row commencing with the third chip has to be shifted one chip to the right to fill the spare chip, these chips are all represented by b. The seventh and eighth chips in the fourth, R4, row are represented by c for the same reasons previously given, and the data in the seventh chip in the fifth row, R5, is represented by D since it has only been transferred within the same column.

Figure 7:
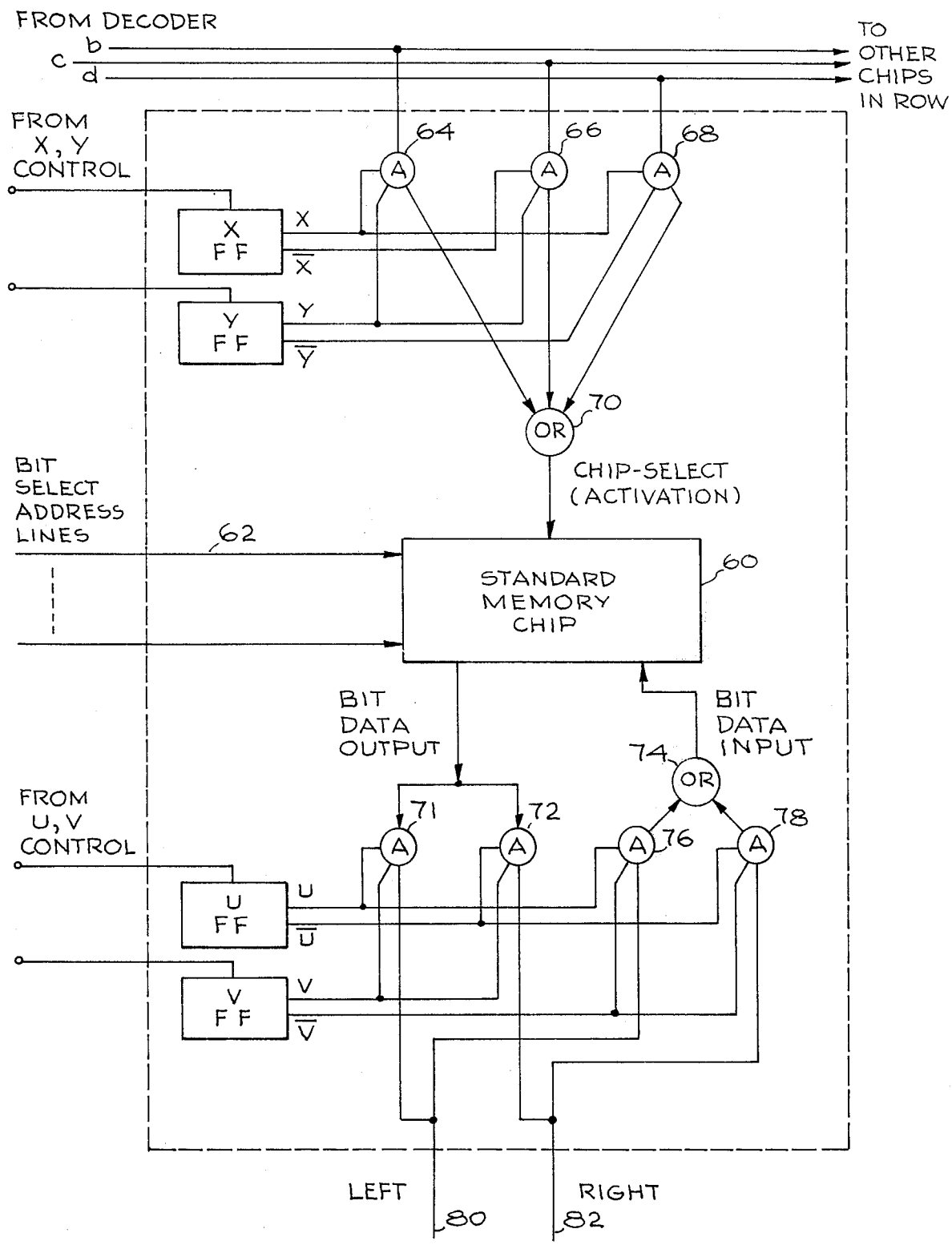
FIG. 7 illustrates another arrangement for a memory chip in accordance with this invention.

FIG. 7 is a block schematic diagram illustrating the electronic circuitry required for a chip in order to operate a reconfigurable memory, in accordance with this invention. A standard memory chip 60, has the usual bit select address lines, 62, for example. The chip select function requires, for each chip 60, three AND gates respectively 64, 66, and 68, and an OR gate 70. The OR gate receives the outputs of the three AND gates 64, 66, 68 and in response thereto provide a chip select voltage to the standard memory chip to which it is connected. One of the inputs to each of the AND gates is a connection to the respective control lines and is here designated by lower case letters b, c, d. Thus the respective inputs to the AND gates 64, 66, 68 are respectively from the control lines b, c, d.

Two flip-flop circuits respectively designated as X and Y, are provided for each chip in a memory. Flip-flop outputs are designated as X and $\overline{X}$, and Y and $\overline{Y}$. These flip-flops are actuated for the purpose of selecting which one of the AND gates is enabled to select which one of the control lines b, c, d will actuate the memory chip. The X output of the X flip-flop constitutes the second input to AND gates 64, 68. The $\overline{X}$ output of the X flip-flop constitutes a second input to the AND gate 66. The Y output of the Y flip-flop constitutes a third input to AND gate 64 and 66. The $\overline{Y}$ output of flip-flop Y constitutes a third input to the AND gate 68. Table 1 shown below indicates which outputs of the X and Y flip-flops are required for the selection of one or none of the three control lines.

TABLE 1

| | select | |
|---|---|---|
| X | Y | b |
| $\overline{X}$ | Y | c |
| X | $\overline{Y}$ | d |
| $\overline{X}$ | $\overline{Y}$ | none |

Each standard memory chip has two lines emanating therefrom, one of which is called the bit data output line and the other is the bit input line. The bit data output line is connected to two AND gates respectively, 71, 72. The bit data input line receives the output of OR gate 74. The OR gate is enabled in response to the outputs from one or the other of two AND gates respectively 76, 78. The data lines are designated by the reference numerals 80, 82 for the respective left and right data lines. One input into each one of the respective AND gates 76 and 78 constitutes a connection respectively to the left and right data lines 80 and 82. These two data lines also serve as the outputs from the respective AND gates 71 and 72. Flip-flops U and V control which ones of the AND gates 71 and 72, or 76 and 78 is enabled. The U output of flip-flop U is connected to the inputs of AND gates 71, 72, and 76. The $\overline{U}$ output of flip-flop U is connected to the input of flip-flop 72 and 78. The V output of flip flop V is connected to the inputs of AND gates 71 and 72. The $\overline{V}$ output of flip-flop V is connected to the inputs to 76 and 78. The settings required for flip-flops U and V for the selection of the AND gates to enable bit data input through the left or right lines 80, 82, or bit data output by way of the left or right lines, is shown in the table 2 reproduced below.

TABLE 2

| | | LEFT | RIGHT |
|---|---|---|---|
| U | V | ✓ | — |
| $\overline{U}$ | V | — | ✓ |
| U | $\overline{V}$ | — | — |
| $\overline{U}$ | $\overline{V}$ | — | — | a pair of U and V flip-flops in addition to the gates 71, 72, 74, 76 and 78 is required for each chip. These together with flip-flops X and Y and gates 64, 66, 68, 70 may be deposited on a memory chip using well known LSI techniques.

On each chip, both sets of flip-flops are set before a reconfiguration occurs to be responsive to one of the control lines and to connect to one of the data lines. After a reconfiguration the chips affected by the reconfiguration have their sets of flip-flops set to select a control line which will enable them to respond to the same address signal as before, and to select a data line, in accordance with the rules specified above.

The determination as to which chips in a memory are defective and their location so that reconfiguration can be performed, is a function which is carried out by well known test equipment, commonly known as a memory exerciser, or memory diagnostic programs are performed by computers on their memories for this purpose. Upon determining which memory chips are defective, the data is transferred into a buffer memory, to be stored until the switches 52 and 54 in FIG. 3 or the flip-flops X, Y and U, V in FIG. 7 are set for defective chips and for chips affected by the reconfiguration in accordance with the rules for reconfiguration described previously herein. Thereafter the data is transferred out of the buffer back into the memory, using the same addresses as formerly.

FIG. 8 is a block schematic diagram illustrating, by way of example, how the reconfigurable memory would be operated within a computer. The computer is enclosed within the dashed lines. There is included and represented within the lines a reconfigurable memory 92, a conventional single bit error correcting and detecting network, 94, a buffer store, 96, the portion of the computer 98 that under program control performs the diagnostic and reconfiguration operation which results in output signals which set the X, Y and U, V flip-flops, and finally the remainder of the computer system 100.

Under computer program control anytime that the error correcting and detecting network, which continuously surveys the memory output, detects an error or errors, the computer directs a diagnostic routine to be performed. The memory contents are transferred to the buffer store through the error correcting and detecting network. Errors in the data output from the memory and detected and signalled to the diagnostic and reconfiguration control portion of the computer, which under computer program control, determines the location of the chip causing the error and generates the signals required for setting the X, Y and U, V flip-flops of the memory to accomplish a reconfiguration in accordance with this invention.

Thereafter the buffer store is instructed by the computer programs to return the stored data to the memory, and at this time the returning data is transferred and stored in chips in the memory in accordance with the memory reconfiguration, as has been previously described. The memory can then be used again and will respond to the same addresses as were used previously.

Accordingly there has been described and shown here a novel and useful reconfigurable memory which can redistribute the data, which would otherwise be stored in defective memory chips in a manner which minimizes the requirement for spare chips, enables the memory to still be used despite the presence of defective chips, and which permits the use of the same addresses for storing and retrieving information as are used when there are no faulty chips present in the memory.

What is claimed is:

1. In a memory system of the type having memory chips arranged in rows and columns and having a spare column of chips at one side adjacent the last column of chips of said memory, the method of reconfiguring said memory to take care of $n$ defective chips in a row, where $n$ is greater than 1, comprising transferring, in the row containing defective chips commencing with the $n$th defective chip, which is adjacent a good chip and closest to the spare chip in that row, the data in the row to adjacent chips in that row in the direction of the spare chip column to fill the spare chip in that row, transferring the data in chips, in each of the ($n-1$) successively adjacent rows to the row containing defective chips to adjacent chips in a row, in a direction toward the spare chip column, said transfers in successively adjacent rows commencing with the chip in each row in the same column as the first defective chip, transferring the data from chips in one row to chips in the same column in an adjacent row commencing with the data to have been stored in the ($n-1$) defective chips and extending through ($n-1$) successive rows, the number of chips in a row from which data is transferred to the next adjacent row being determined by the number of chips from which data is received from the preceding adjacent row said number decreasing by at least one with each successive transfer, applying address signals to said memory system for a row of chips as if there were no defective chips in said memory system, and actuating, in response to said address signals, all chips containing data for the addressed row regardless of whether or not said chips are in the row addressed by said address signals.

2. In a memory system as recited in claim 1, wherein said step of actuating in response to said address signals, all chips containing data for the addressed now regardless of whether or not said chips are in the row addressed by said address signals, includes applying, in response to a row address signal, a chip exciting signal to a plurality of rows containing chips storing data for the addressed row, and selectively applying said chip exciting signal only to those chips storing data for the row of chips addressed.

3. In a memory system as recited in claim 2 wherein a data line is provided between columns of chips and a data line is provided between the first column of chips and the spare column of chips, the steps of connecting all chips which have received data from an adjacent chip in the same row to the data line to its left, and connecting all other chips to the data line to the right.

4. In a memory system as recited in claim 3 wherein in addition to said $n$ defective chips in a row there are spaced therefrom $m$ defective chips the additional memory reconfiguring steps, after having reconfigured said memory to take care of said $n$ defective chips, of transferring in each of $m$ successive rows which are adjacent to the $n$th row, data from one chip to an adjacent chip in a row commencing with the column of chips in the same column as the first of said $m$ defective chips and extending in the direction of said spare column of chips, transferring the data from chips in one row to chips in te same column as an adjacent row commencing with the data in said $m$ defective chips and extending through $(n-1+m)$ successive rows, the number of chips in a row from which data is transferred to a successive row being the same until after $(n-1)$ rows when the number of chips from which a transfer is made to a succeeding adjacent row decreases by at least one with each successive transfer.

5. In a memory system as recited in claim 4 wherein data line is provided between columns of chips and data line is provided between the first column of chips and the spare column of chips, the steps of connecting all chips which have received data from an adjacent chip in the same row to the data line to its left, connecting all chips in the same columns as the $m$ defective chips which, have received data from an adjacent row to the data lines to their left, with the exception of the last chip to receive data from an adjacent row and connecting all other chips in said memory system, including said last chip, to the data lines to their right.

6. A reconfigurable memory system of the type having chips arranged in columns and rows and a spare column of chips on one side, the improvement comprising a plurality P of control lines for each row of chips, means for addressing a single row of chips, means responsive to said means for addressing for applying an enabling signal to a control line for P adjacent rows including the addressed row, first switch means for each chip in a row for selectively connecting each said chip to one of the P control lines for that row, a data line extending between each column of chips and between the spare column and the first column of chips, and second switch means for each chip for selectively connecting each chip in said memory system to one of the data lines at either side of said chip.

7. In a memory chip of the type having means for storing a plurality of bits of data a control terminal to which a selecting signal must be applied to enable data write in or read out and a first and second data line for receiving input and for applying output from said memory chip, the improvement comprising a first switch means connected to said control terminal for enabling selection of one of a plurality of inputs to said control terminal, and a second switch means for enabling output to be applied to and input to be received from a predetermined one of the said data lines.

a first switch means connected to said control terminal for enabling selection of one of a plurality of inputs to said control terminal, and a second switch means for enabling output to be applied to and input to be received from a predetermined one of the said data lines.

* * * * *